(12) United States Patent
Yu et al.

(10) Patent No.: US 12,176,426 B2
(45) Date of Patent: Dec. 24, 2024

(54) BIPOLAR TRANSISTOR STRUCTURE ON SEMICONDUCTOR FIN AND METHODS TO FORM SAME

(71) Applicant: GlobalFoundries U.S. Inc., Malta, NY (US)

(72) Inventors: Hong Yu, Clifton Park, NY (US); Alexander M. Derrickson, Saratoga Springs, NY (US); Judson R. Holt, Ballston Lake, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 154 days.

(21) Appl. No.: 17/657,154

(22) Filed: Mar. 30, 2022

(65) Prior Publication Data

US 2023/0223462 A1    Jul. 13, 2023

Related U.S. Application Data

(60) Provisional application No. 63/266,598, filed on Jan. 10, 2022.

(51) Int. Cl.
*H01L 29/73* (2006.01)
*H01L 29/06* (2006.01)
(Continued)

(52) U.S. Cl.
CPC .......... *H01L 29/73* (2013.01); *H01L 29/0653* (2013.01); *H01L 29/0804* (2013.01);
(Continued)

(58) Field of Classification Search
CPC . H01L 29/73; H01L 29/0653; H01L 29/0804; H01L 29/0821; H01L 29/1095; H01L 29/66234; H01L 29/0692; H01L 27/0623; H01L 21/8249; H01L 21/8248; H01L 21/84; H01L 21/8222;
(Continued)

(56) References Cited

U.S. PATENT DOCUMENTS 6,174,779 B1 * 1/2001 Shino ................ H01L 29/7317
438/335
6,949,764 B2   9/2005 Ning
(Continued)

OTHER PUBLICATIONS

European Search Report for corresponding EP Application No. 22206418.0 dated May 22, 2023, 8 pages.

*Primary Examiner* — Natalia A Gondarenko
(74) *Attorney, Agent, or Firm* — Francois Pagette; Hoffman Warnick LLC

(57) ABSTRACT

Embodiments of the disclosure provide a bipolar transistor structure including a semiconductor fin on a substrate. The semiconductor fin has a first doping type, a length in a first direction, and a width in a second direction perpendicular to the first direction. A first emitter/collector (E/C) material is adjacent a first sidewall of the semiconductor fin along the width of the semiconductor fin. The first E/C material has a second doping type opposite the first doping type. A second E/C material is adjacent a second sidewall of the semiconductor fin along the width of the semiconductor fin. The second E/C material has the second doping type. A width of the first E/C material is different from a width of the second E/C material.

17 Claims, 17 Drawing Sheets

(51) Int. Cl.
*H01L 29/08* (2006.01)
*H01L 29/10* (2006.01)
*H01L 29/66* (2006.01)

(52) U.S. Cl.
CPC ...... *H01L 29/0821* (2013.01); *H01L 29/1095* (2013.01); *H01L 29/66234* (2013.01)

(58) Field of Classification Search
CPC ............. H01L 21/6835; H01L 29/0657; H01L 29/0684; H01L 29/1008; H01L 29/6625; H01L 29/735; H01L 29/7317; H01L 29/78624; H01L 29/732; H01L 29/063; H01L 29/0649; H01L 29/6656; H01L 29/737; H01L 29/0673; H01L 29/0808; H01L 29/161; H01L 29/0847; H01L 29/2003; H01L 29/205; H01L 29/207; H01L 29/66242; H01L 29/66439; H01L 29/66484; H01L 29/66886; H01L 29/7831; H01L 29/7832; H01L 29/78645; H01L 29/78648; H01L 29/775; H01L 29/78696; H01L 29/42392; H01L 29/36; H01L 27/0259; H01L 27/0229; H01L 27/0274; H01L 27/0277; H01L 27/0647; H01L 27/067; H01L 27/0288; H01L 27/0722; H01L 27/075; H01L 27/0783; H01L 27/1207; H01L 21/02532; H01L 21/0254; H01L 21/02546; H01L 21/02595; H01L 21/26513; H01L 21/26546; H01L 21/26586; H01L 21/30612; H01L 21/3081

USPC ....... 257/565, 526, 306, 355, 133, 141, 197, 257/368, 586, 29.198; 438/433, 359
See application file for complete search history.

(56) References Cited

U.S. PATENT DOCUMENTS

| | | | |
|---|---|---|---|
| 8,258,602 B2 * | 9/2012 | Ke | H01L 29/73 257/E29.174 |
| 8,288,758 B2 | 10/2012 | Ning et al. | |
| 8,420,493 B2 | 4/2013 | Ning et al. | |
| 8,586,441 B1 | 11/2013 | Cai et al. | |
| 9,502,504 B2 | 11/2016 | Cai et al. | |
| 9,553,145 B2 * | 1/2017 | Harame | H01L 29/1004 |
| 9,997,619 B1 * | 6/2018 | Balakrishnan | H01L 29/1008 |
| 10,741,645 B2 | 8/2020 | Balakrishnan et al. | |
| 10,825,921 B2 | 11/2020 | Balakrishnan et al. | |
| 2003/0230788 A1 * | 12/2003 | Fujii | H01L 29/0804 257/E21.552 |
| 2009/0045467 A1 | 2/2009 | Kakoschke et al. | |
| 2010/0320572 A1 | 12/2010 | Chung et al. | |
| 2012/0061802 A1 | 3/2012 | Nicholas et al. | |
| 2015/0102348 A1 | 4/2015 | Cai et al. | |
| 2016/0087068 A1 | 3/2016 | Cai et al. | |
| 2018/0269289 A1 * | 9/2018 | Balakrishnan | H01L 29/735 |
| 2019/0088766 A1 * | 3/2019 | Pandey | H01L 29/165 |
| 2019/0140083 A1 * | 5/2019 | Pan | H01L 29/735 |
| 2020/0321466 A1 * | 10/2020 | Cortes | H01L 29/78603 |
| 2023/0066963 A1 | 3/2023 | Yu et al. | |

* cited by examiner

BIPOLAR TRANSISTOR STRUCTURE ON SEMICONDUCTOR FIN AND METHODS TO FORM SAME

BACKGROUND

1. Technical Field

The present disclosure provides a bipolar structure transistor on a semiconductor fin and methods to form the same.

2. Background Art

Present technology is at atomic level scaling of certain micro-devices such as logic gates, bipolar transistors, field effect transistors (FETs), and capacitors. Circuit chips with millions of such devices are common. The structure of a lateral bipolar transistor defines several of its properties during operation. Conventional integrated circuits may employ vertical bipolar transistors of various compositions, but these types of devices may have higher costs and/or operational parameters that do not meet certain constraints.

SUMMARY

The illustrative aspects of the present disclosure are designed to solve the problems herein described and/or other problems not discussed.

Embodiments of the disclosure provide a bipolar transistor structure including: a semiconductor fin on a substrate, the semiconductor fin having a first doping type, a length in a first direction, and a width in a second direction perpendicular to the first direction; a first emitter/collector (E/C) material adjacent a first sidewall of the semiconductor fin along the width of the semiconductor fin, the first E/C material having a second doping type opposite the first doping type; and a second E/C material adjacent a second sidewall of the semiconductor fin along the width of the semiconductor fin, the second E/C material having the second doping type, wherein a width of the first E/C material is different from a width of the second E/C material.

Further embodiments of the disclosure provide a bipolar transistor structure including: a semiconductor fin on a substrate, the semiconductor fin having a first doping type, a length in a first direction, and a width in a second direction perpendicular to the first direction, wherein the semiconductor fin includes: a first portion, and a second portion coupled to a base contact and adjacent the first portion along the length of the semiconductor fin, wherein a dopant concentration of the second portion is greater than a dopant concentration of the first portion; a first emitter/collector (E/C) material adjacent a first sidewall of the second portion along the width of the semiconductor fin, the first E/C material having a second doping type opposite the first doping type; and a second E/C material adjacent a second sidewall of the second portion along the width of the semiconductor fin, the second E/C material having the second doping type, wherein a width of the first E/C material is different from a width of the second E/C material.

Additional embodiments of the disclosure provide a method of forming a bipolar transistor structure, the method including: forming a semiconductor fin on a substrate, the semiconductor fin having a first doping type, a length in a first direction, and a width in a second direction perpendicular to the first direction; forming a first emitter/collector (E/C) material adjacent a first sidewall of the semiconductor fin along the width of the semiconductor fin, the first E/C material having a second doping type opposite the first doping type; and forming a second E/C material adjacent a second sidewall of the semiconductor fin along the width of the semiconductor fin, the second E/C material having the second doping type, wherein a width of the first E/C material is different from a width of the second E/C material.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
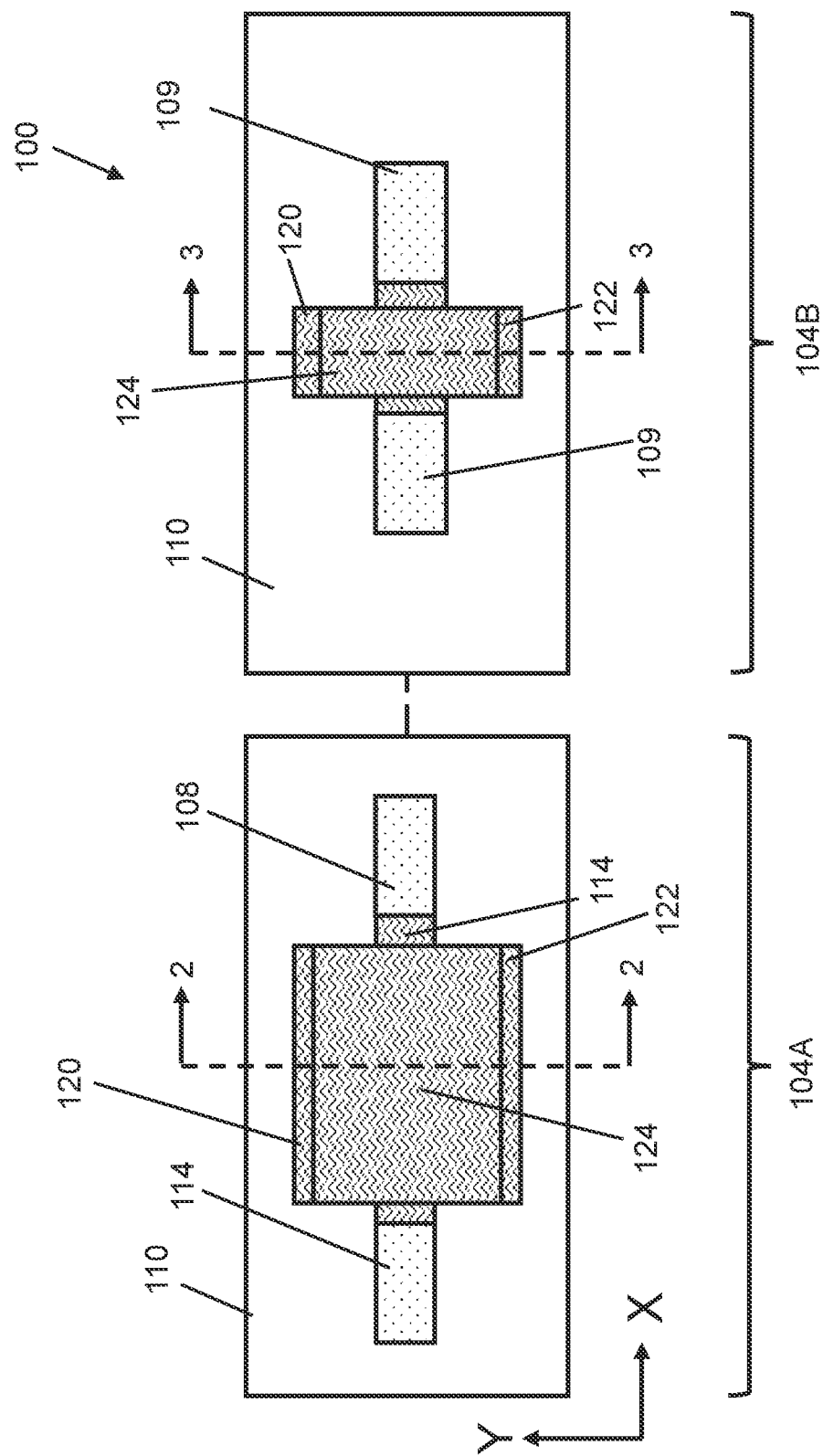
FIG. 1 depicts a plan view of an initial structure to be processed according to embodiments of the disclosure

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Embodiments of the disclosure provide a bipolar transistor on a semiconductor fin. Semiconductor fins are conventionally used to form field effect transistors (FETs), and such structures are traditionally considered incompatible with the operation of a bipolar transistor. Embodiments of the disclosure provide a structure and method to form a bipolar transistor on a semiconductor fin, in which the emitter of the bipolar transistor is sized differently from the collector of the bipolar transistor. A bipolar transistor according to the disclosure includes a semiconductor fin on a substrate. The semiconductor fin may have a first doping type (e.g., p type doping), a length in a first direction, and a width in a second direction perpendicular to the first direction. The semiconductor fin may be subdivided into distinct portions. A first portion of the semiconductor fin may be adjacent a second portion along a length of the semiconductor fin. A dopant concentration of the first portion may be greater than a dopant concentration of the second portion.

The bipolar transistor structure includes a first emitter/collector (E/C) material adjacent a first sidewall of the semiconductor fin along the width of the semiconductor fin. The first E/C material may have a second doping type opposite the first doping type (e.g., n type doping). A second E/C material is adjacent a second sidewall of the semiconductor fin along the width of the semiconductor fin, and thus is opposite the first E/C material. The second E/C material also has the second doping type and may have a width that is different from a width of the first E/C material. That is, either the first E/C material or the second E/C material may be wider than the other E/C material and thus may protrude further outward from the semiconductor fin. The width(s) of each E/C material may be controlled, e.g., by using a spacer material to define the maximum width for growing E/C material(s) on the semiconductor fin.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the physical interface between the two semiconductor materials.

Figure 2:
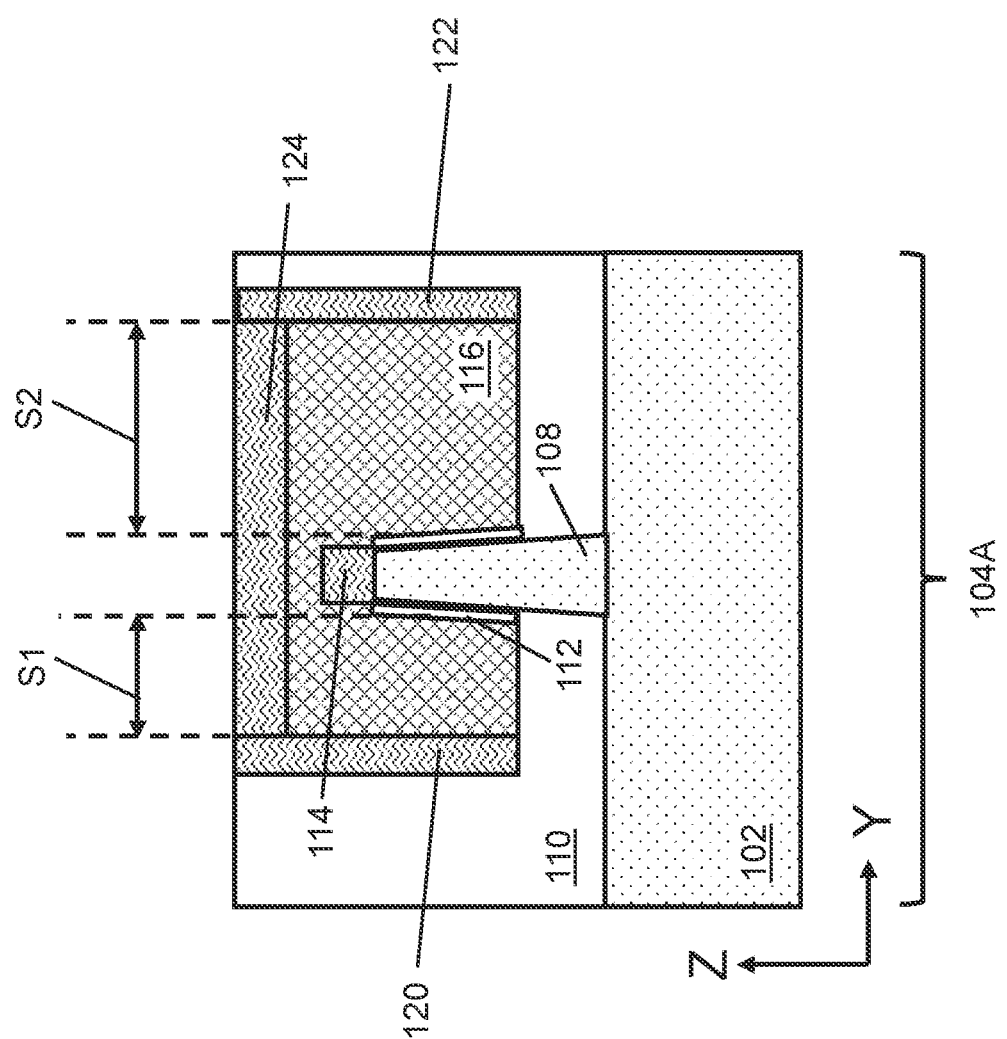
FIG. 2 depicts a cross-sectional view of a first area of the initial structure to be processed along line 2-2 of FIG. 1.
Figure 3:
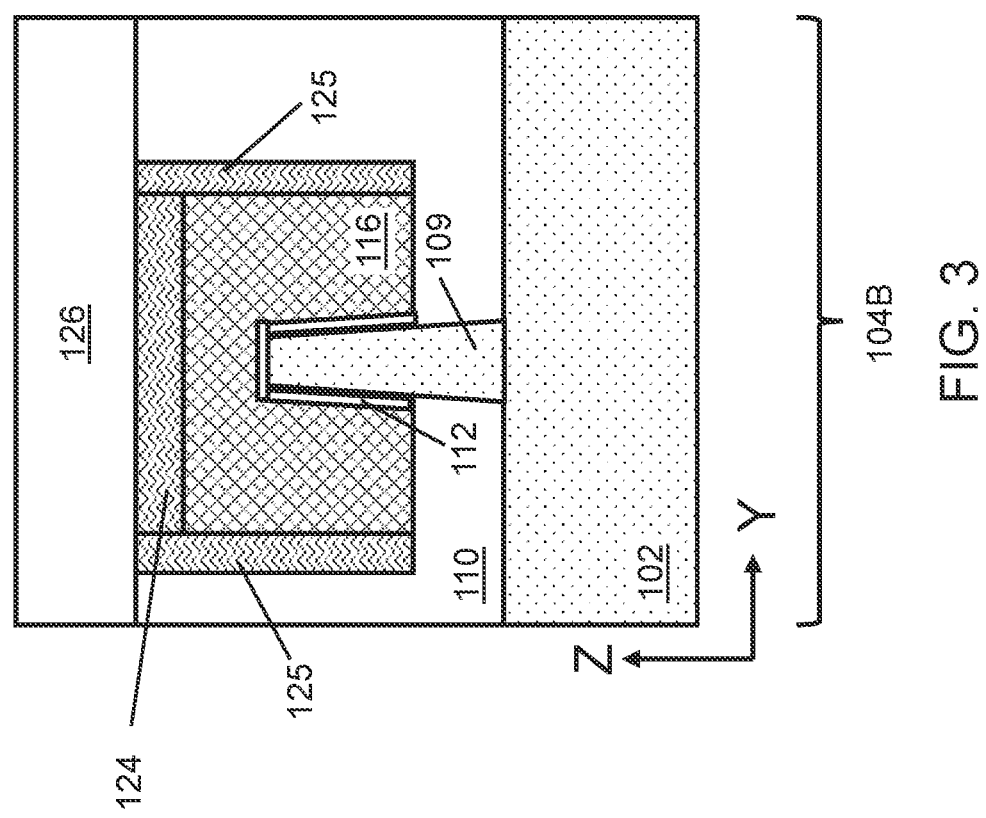
FIG. 3 depicts a cross-sectional view of a second area of the initial structure to be processed along line 3-3 of FIG. 1.

Referring to FIGS. 1-3, a preliminary structure 100 (simply "structure" hereafter) suitable to form a bipolar transistor structure according to embodiments of the disclosure is shown. Preliminary structure 100 may be processed as described herein to yield one or more bipolar transistor structures. However, it is understood that other techniques, ordering of processes, etc., may be implemented to yield the same bipolar transistor structure(s) or similar bipolar transistor structures in further embodiments. FIG. 1 shows a plan view of structure 100 in plane X-Y, whereas FIG. 2 provides a first cross-sectional view of structure 100 in plane Y-Z along view line 2-2 in FIG. 1, and FIG. 3 provides a second cross-sectional view of structure 100 in plane Y-Z along view line 3-3 in FIG. 1. Structure 100 may be formed on a substrate 102 (FIGS. 2, 3 only) including, e.g., one or more semiconductor materials. Substrate 102 may include but is not limited to silicon, germanium, silicon germanium (SiGe), silicon carbide, or any other common IC semiconductor substrates. In the case of SiGe, the germanium concentration in substrate 102 may differ from other SiGe-based structures described herein. A portion or entirety of substrate 102 may be strained. Substrate 102 may be subdivided into, e.g., a bipolar transistor area 104A and a complementary metal oxide semiconductor (CMOS) area 104B targeted for the forming of different types of devices. Areas 104A, 104B may be structurally indistinguishable from each other within substrate 102, and the boundary between areas 104A, 104B of substrate 102 may be arbitrary. As discussed herein, both areas 104A, 104B may include semiconductor fins but area 104A may be used to form a bipolar transistor whereas area 104B may be used to form a CMOS device, such as a fin-type field effect transistor (FinFET). A dotted line is shown between areas 104A, 104B in FIG. 1 to indicate that the distance between areas 104A, 104B can be of any conceivable size or scale.

Referring specifically to FIGS. 2 and 3, structure 100 may be processed to define a set of semiconductor fins 108, 109 on various portions of substrate 102, e.g., by removing portions of an initial semiconductor material (e.g., by targeted etch) to a predetermined depth. A mask (not shown) or similar material may be formed over various portions of substrate 102, while others are removed to a predetermined depth and/or over a predetermined interval. Portions of semiconductor material may remain intact as semiconductor fins 108, 109 on and above substrate 102, e.g., due to the prior masking and/or non-etching of materials in selected locations. The processing of semiconductor layers to define semiconductor fins 108, 109 also may be implemented according to any other currently known or later developed semiconductor fin formation technique. Semiconductor fins 108 are in first area 104A, whereas semiconductor fins 109 are in second area 104B. Semiconductor fins 108, 109 may have similar or identical sizes and/or compositions and may be distinguishable solely based on their relative positions in structure 100.

Structure 100 may include embedded elements for electrically separating active materials formed over substrate 102, e.g., semiconductor fins 108, 109 from other regions and/or materials. An insulator layer 110 such as a trench isolation (TI) may be formed over areas 104A, 104B of substrate 102, e.g., by forming a layer of dielectric material (e.g., oxide or nitride insulative material), a higher-resistive material such as polycrystalline or amorphous silicon (poly-Si), and/or other materials. A lower portion of each semiconductor fin 108, 109 may be adjacent insulator layer 110. As examples, insulator layer 110 may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

As also shown in FIGS. 2 and 3, each semiconductor fin 108, 109 may have an insulative film 112 thereon, e.g., covering sidewalls and an upper surface of each semiconductor fin 108, 109. Insulative film(s) 112 may include insulative materials similar to or different from insulator layer 110 and may be formed to control where overlying conductive and/or semiconductive materials may be formed in contact with the upper surface and sidewalls of semiconductor fin(s) 108, 109. Semiconductor fins 108, 109 optionally may have an insulative cap 114 (not shown on fin 109 in FIG. 3) on its upper surface in place of additional insulative layer 110 material. Insulative cap 114 may have a composition different from insulator layer 110, e.g., silicon nitride (SiN) and/or other nitride-based insulators to protect insulative cap 114 from being removed when portions of insulative layer 110 are removed in subsequent processing. Although insulative cap 114 is not shown on semiconductor fin 109 in FIG. 3, semiconductor fin 109 may have insulative cap 114 thereon in further implementations.

Each semiconductor fin 109 may have a semiconductor layer 116 thereover, and within a portion of insulator layer 110. Semiconductor layer 116 may be formed, e.g., as a placeholder "dummy" material for sizing and positioning of adjacent materials and thus may be removed and replaced with other types of material in other phases of processing. Semiconductor layer 116, in some cases, may be free of dopants and thus may include relatively less conductive material(s) and/or other materials suitable for selective removing (e.g., by targeted etch). Semiconductor layer 116 may thus have a layer of amorphous silicon (a-Si) and/or similar inactive materials formed over semiconductor fins 108, 109, e.g., by removing portions of insulator layer 110 to form an opening and expose insulative film(s) 112 (and insulative cap 114 where applicable) and filling the opening by depositing amorphous semiconductor material(s) therein.

Structure 100 also may include a set of spacers including a first spacer 120 and a second spacer 122, each adjacent an opposite horizontal end of semiconductor layer 116. Each spacer 120, 122 may include one or more insulative spacer materials (e.g., one or more oxide, nitride, and/or other insulators) formed initially as a single layer or film on insulator layer 110 and semiconductor fins 108, 109, before being partially removed (e.g., by targeted etch). The remaining spacer material may be alongside sidewalls of insulator layer 110, while also being horizontally adjacent semiconductor layer 116 once it is formed. In addition to providing electrical isolation, spacers 120, 122 may define the shape and size and various active materials in a bipolar transistor structure.

As shown in FIG. 2, spacers 120, 122 in area 104A may be horizontally separated from semiconductor fin 108 by distinct horizontal separation distances S1, S2. For example, first spacer 120 may be horizontally displaced from one sidewall semiconductor fin 108 along the Y-axis by separation distance S1, whereas second spacer 122 may be horizontally displaced from the opposite sidewall of semiconductor fin 108 along the Y-axis by a larger separation distance S2. According to one example, first distance S1 may be approximately five nanometers (nm) and second separation distance S2 may be approximately ten nm. Since semiconductor fin 108 may have sloped sidewalls, as illustrated the accompanying FIGS., each separation distance S1, S2 may be measured with respect to a top surface of semiconductor fin 108, a bottom surface of semiconductor fin 108, and/or any predetermined reference point along the sidewall(s) of semiconductor fin above isolation layer 110. However, first separation distance Si may be larger than second separation distance S2 in other implementations. A masking layer 124 also may be located over semiconductor layer 116, e.g., to enable selective processing of semiconductor layer 116 over semiconductor fins 108 without affecting similar materials over semiconductor fins 109. Masking layer 124 may include the same and/or similar materials to those included within spacers 120, 122.

Referring to FIG. 3, second area 104B may have a set of spacers 125 horizontally adjacent semiconductor fin 109. Each spacer 125 in second area 104B may have the same composition and/or similar compositions to spacers 120, 122, but may be symmetric about semiconductor fin 109, if desired. Spacers 125 are not necessarily asymmetric about semiconductor fin 109, as compared with the asymmetric positions of spacers 120, 122 about semiconductor fin 108. Spacers 125, more generally, may have any size, shape, and/or configuration suitable for processing of a conventional device (e.g., non-bipolar transistor). Methods according to the disclosure may include positioning a lithographic mask 126 (e.g., any conceivable masking material) over second area 104B to allow first area 104A to be processed independently of any material(s) within second area 104B.

Figure 4:
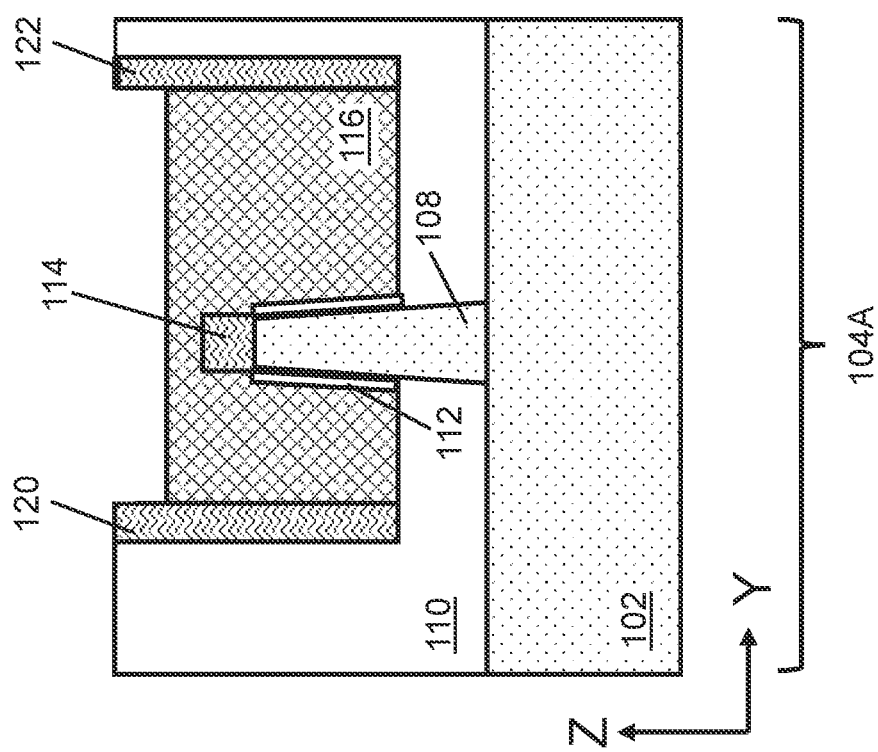
FIG. 4 depicts a cross-sectional view of removing a masking material over the first area according to embodiments of the disclosure.

Turning briefly to FIG. 4, embodiments of the disclosure may include removing masking layer 124 (FIGS. 1-3) from first area 104A to expose semiconductor layer 116 thereunder. The removing of masking layer 124 may be implemented, e.g., by selective etching of exposed nitride materials without affecting non-nitride materials elsewhere (e.g., insulator layer 110, spacers 120, 122, etc.). Semiconductor fin 108, insulative film 112, and/or insulative cap 114 may remain beneath semiconductor layer 116 after masking layer 124 is removed.

Figure 5:
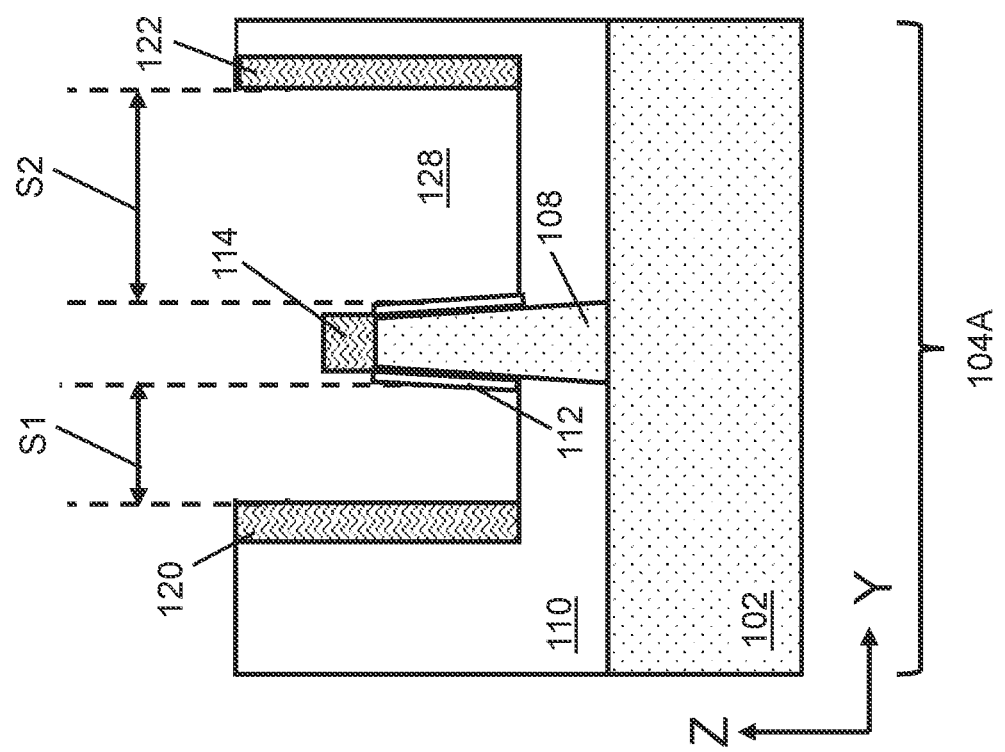
FIG. 5. depicts a cross-sectional view of removing a semiconductor material over the first area according to embodiments of the disclosure.

Turning to FIG. 5, continued processing may include removing semiconductor layer 116 to define an opening 128 horizontally between spacers 120, 122 and adjacent each size of semiconductor fin 108 in plane Y-Z. Opening 128 may retain the same horizontal dimensions as semiconductor layer 116 by selectively removing the material(s) within semiconductor layer 116 (e.g., amorphous Si) without affecting insulative materials adjacent or below semiconductor layer 116. Selective etching of semiconductor material may prevent insulative film 112 and/or insulative cap 114 from being removed together with semiconductor layer 116. Opening 128 thus may horizontally separate one sidewall of semiconductor fin 108 from spacer 120 by first separation distance S1. Opening 128 also separates the opposite sidewall of semiconductor fin 108 from spacer 122 by second separation distance S2 that is different from first separation distance S1. Although opening 128 is shown by example to extend only partially into insulator layer 110 such that a remaining portion of insulator layer 110 separates opening 128 from substrate 102, this is not necessarily required in all implementations.

Figure 6:
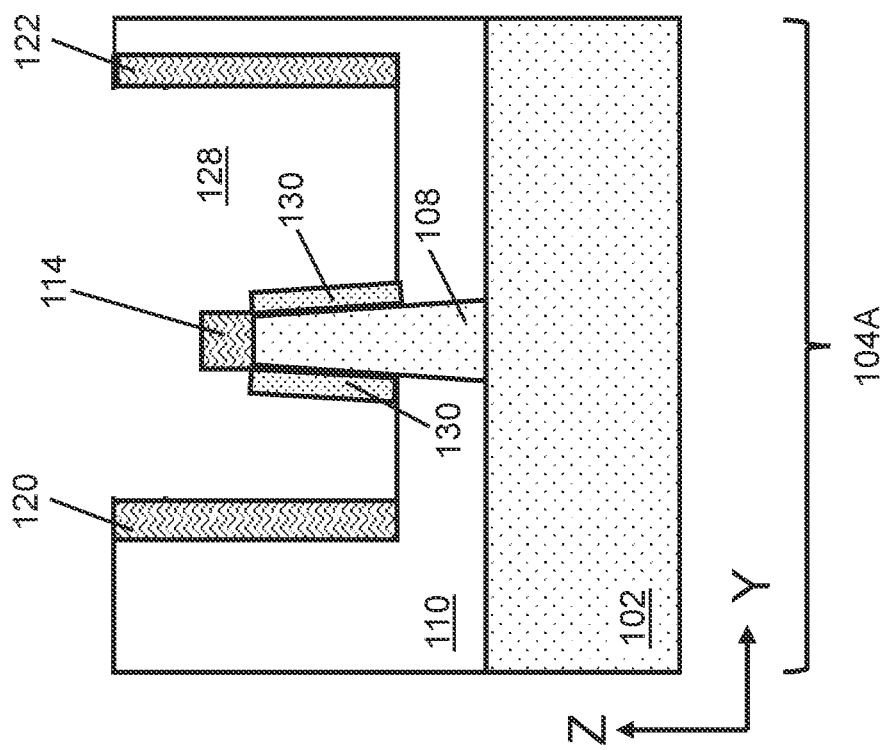
FIG. 6 depicts a cross-sectional view of forming a base material over the first area according to embodiments of the disclosure.

Referring to FIG. 6, methods according to the disclosure may include removing insulative film 112 from semiconductor fin 108, and then forming a base material 130 on sidewalls of semiconductor fin 108. Insulative film 112 may be removed, e.g., by selective etching of oxide material(s), and such etching may also remove an insignificant portion of insulator layer 110 thereunder. Base material 130 may have a different composition from that of semiconductor fin 108, e.g., it may include silicon germanium (SiGe) in the case where semiconductor fin 108 includes crystalline silicon (Si). Base material 130 may be formed, e.g., to allow condensation of base material 130 into semiconductor fin 108 and define active regions of an eventual bipolar transistor.

Figure 7:
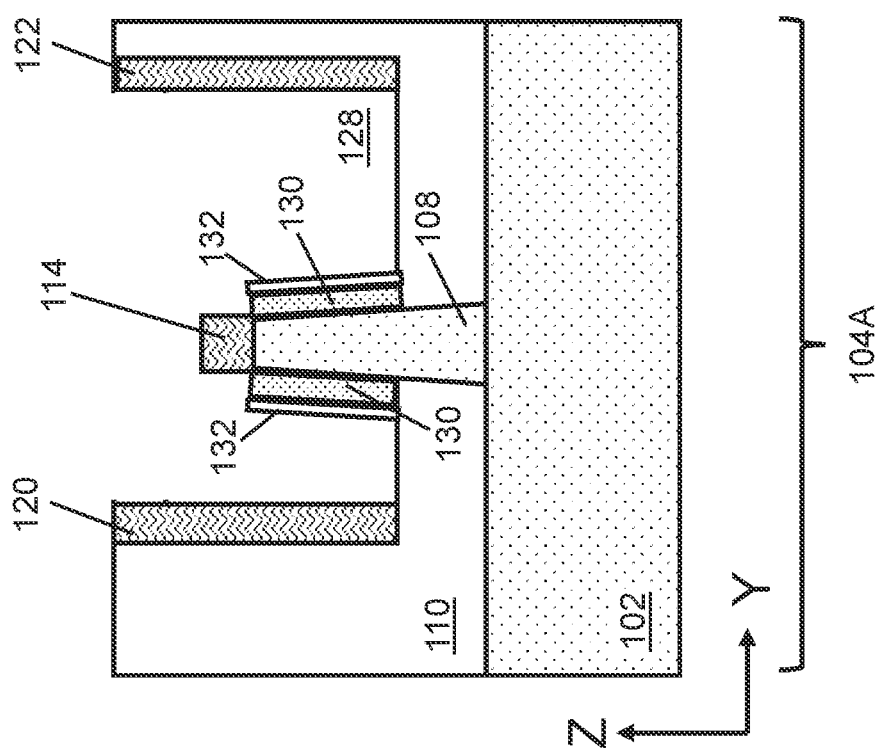
FIG. 7 depicts a cross-sectional view of forming an insulator on the base material according to embodiments of the disclosure.

As shown in FIG. 7, methods of the disclosure may include forming an insulator film 132 on base material 130. Insulator film 132 may include oxide material(s) to allow underlying materials to pass into semiconductor fin 108, and/or to protect base material 130 from being removed and/or chemically modified in subsequent processing. Insulator film 132 may include any currently known or later developed insulator, and more specifically, may include, for example, one or more layers of oxide formed on base material 130. Insulator film 132 may be formed by selective deposition, e.g., to prevent additional insulator from being formed on insulator layer 110, spacers 120, 122, etc.

Figure 8:
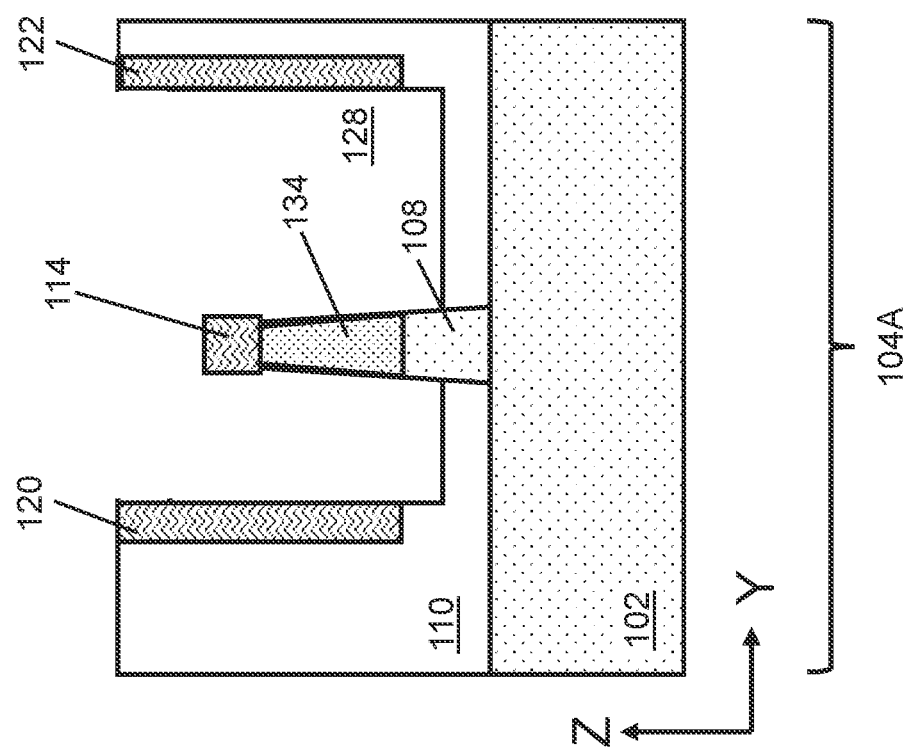
FIG. 8 depicts a cross-sectional view of condensation of the base material to form a base region within a semiconductor fin according to embodiments of the disclosure.

FIG. 8 depicts an example process for migrating semiconductor materials (e.g., SiGe or Ge) from base material 130 (FIG. 7) into semiconductor fin 108 to form an intrinsic base region 134 within semiconductor fin 108. Semiconductor materials other than crystalline Si may offer various operational advantages, e.g., greater electron mobility and/or charge mobility, as compared to other types of semiconductor materials. The condensation of base material 130 may include, e.g., intermittent etching of insulator film 132 (FIG. 7). The intermittent etching of insulator film 132 also causes the composition of base material 130 to migrate into semiconductor fin 108 by condensation, thereby producing intrinsic base region 134. Further embodiments of the disclosure may rely upon other material migration techniques (e.g., dopant outdiffusion from semiconductor fin 108 into layer(s) formed thereon) to produce intrinsic base region 134.

One example of such a process may include, e.g., semiconductor fin 108 initially including boron doped silicon and using dopant outdiffusion to reduce the boron concentration in portions of semiconductor fin 108 to define intrinsic base region 134. Following the condensation of base material 130 to form intrinsic base region 134, insulator film 132 (FIG. 7) may be removed (e.g., by additional etch). Intrinsic base region 134 may be over a remaining portion of semiconductor fin 108 that is on substrate 102 and substantially free from materials that may have migrated from base material 130.

Figure 9:
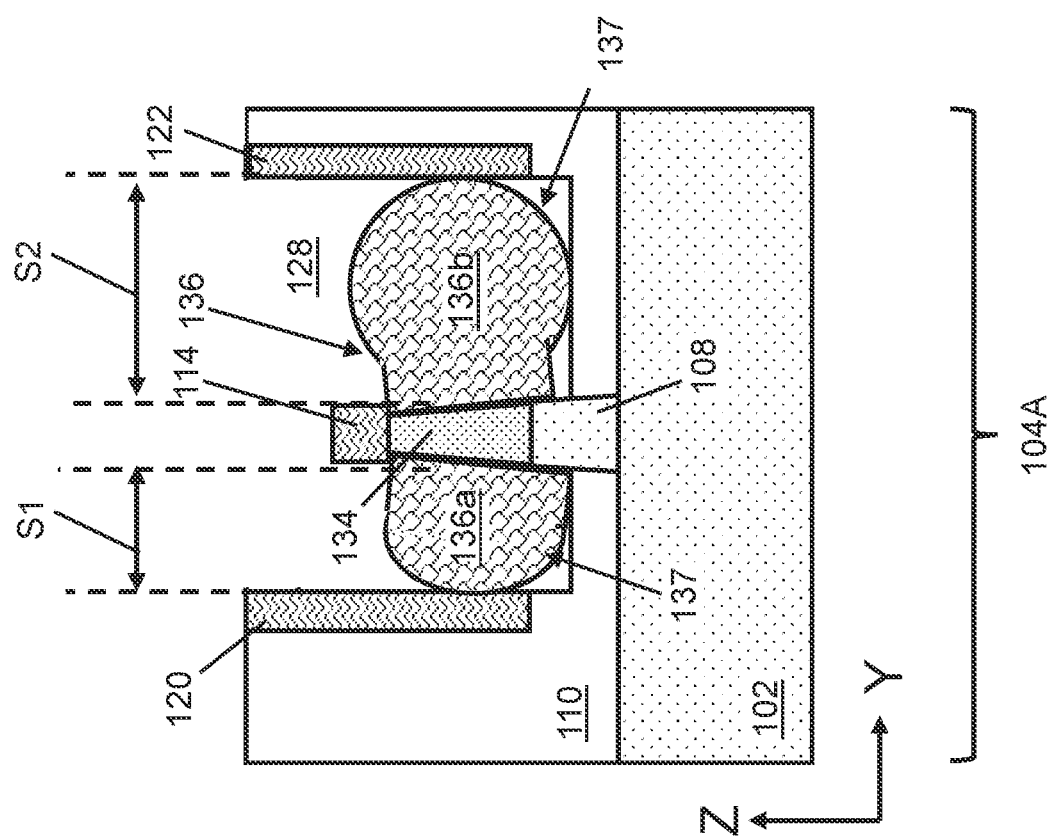
FIG. 9 depicts a cross-sectional view of growing of E/C materials from the base region of the semiconductor fin according to embodiments of the disclosure.

FIG. 9 depicts forming a set of E/C materials 136 on intrinsic base region 134 of semiconductor fin 108. E/C materials 136 may include a first E/C material 136a on a first sidewall of semiconductor fin 108 and a second E/C material 136 on a second, opposite sidewall of semiconductor fin 108. E/C materials 136 may define all or part of the active bipolar transistor materials for emitter and collector terminals of a bipolar transistor structure. E/C materials 136 may be formed on respective sidewalls of semiconductor fin 108, e.g., by epitaxial growth or deposition of doped semiconductor material. E/C materials 136 may include the same material composition as semiconductor fin 108 (e.g., doped silicon germanium (SiGe)), but with an opposite doping type (e.g., they may be doped N type when intrinsic base region 134 is doped P type or vice versa). E/C materials 136 additionally or alternatively may include other electrically active semiconductor materials. E/C materials 136 may be formed to a desired size, in part due to structural support by insulator layer 110. As shown, a lower surface of each E/C material 136 may rest upon an upper surface of insulator layer 110.

Due to being formed by epitaxial growth, the size of E/C materials 136a, 136b can be defined by the relative position of each spacer 120, 122. Spacers 120, 122 may horizontally constrain the horizontal width of each E/C material 136a, 136b, and insulative cap 114 prevents each E/C material 136 from growing over semiconductor fin 108 to form E/C materials 136a, 136b as a single continuous region. The horizontal width of first E/C material 136a may be constrained by spacer 120 to that of first horizontal separation distance S1, whereas the horizontal width of second E/C material 136b may be constrained by spacer 122 to the width of second horizontal separation distance S2. First E/C material 136a thus may have a horizontal width that is different from (e.g., less than) a horizontal width of second E/C material 136b. The growing of E/C materials 136a, 136b may be controlled such that an air gap 137 is defined in remaining vertical space between insulator layer 110 and E/C materials 136a, 136b formed thereover.

Figure 10:
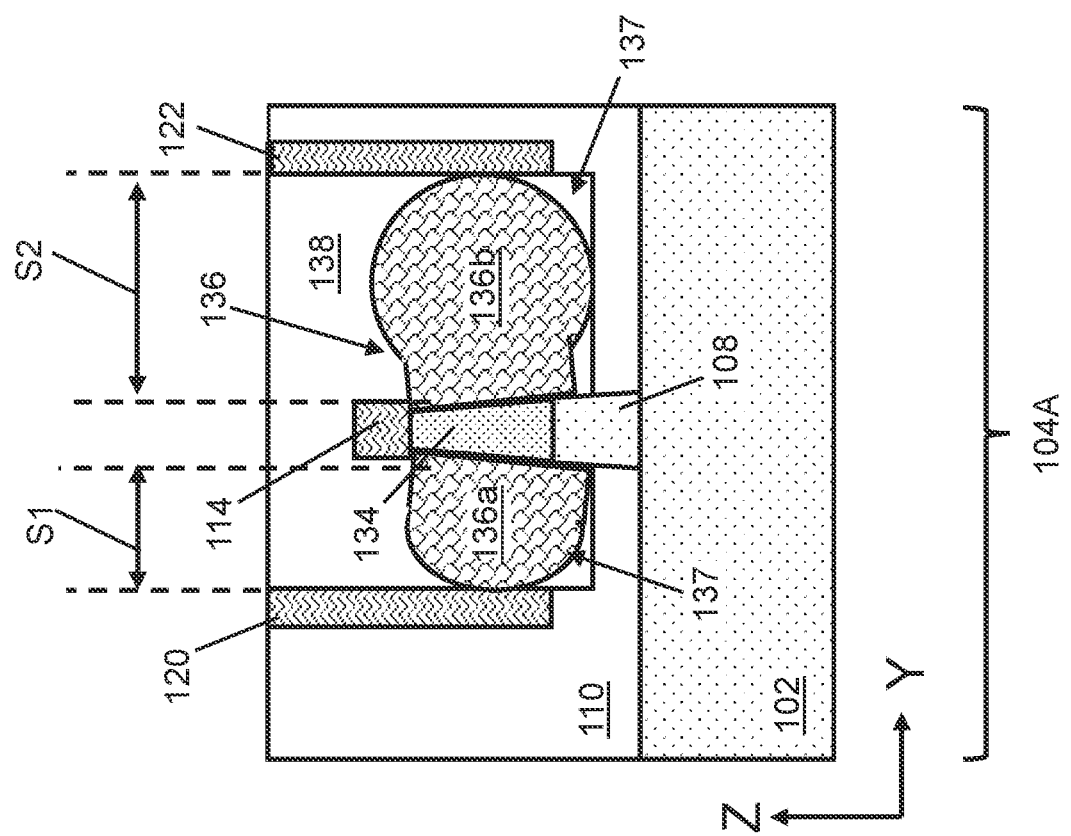
FIG. 10 depicts a cross-sectional view of forming an insulator over the E/C materials according to embodiments of the disclosure.

FIG. 10 depicts filling opening 128 (FIG. 9) with an additional insulator 138 to cover E/C materials 136a, 136b and fill the overlying space between spacers 120, 122. Additional insulator 138 may be planarized (e.g., using chemical mechanical planarization (CMP)) such that its upper surface is substantially coplanar with corresponding upper surfaces of insulator layer 110, spacer 120, and spacer 122. The resulting configuration of intrinsic base region 134 and E/C materials 136a, 136b thus may define emitter, base, and collector terminals of a bipolar transistor structure. Contacts to such materials are formed according to further processes discussed herein.

Figure 11:
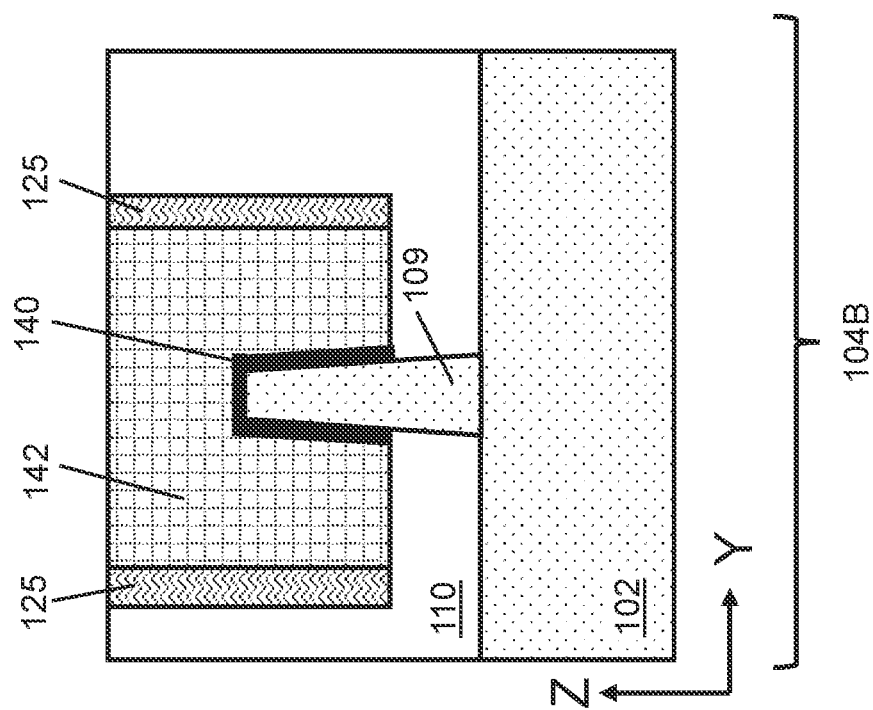
FIG. 11 depicts a cross-sectional view of forming a CMOS structure on the second area according to embodiments of the disclosure.

Turning to FIG. 11, depicting the same cross-sectional view of second area 104B shown in FIG. 3, embodiments of the disclosure remain operable to form field effect transistor structures in second region 104B. Various materials in second region 104B thus may be processed independently of, and/or concurrently with, corresponding materials in first area 104A. For example, the disclosure may include forming a gate dielectric layer 142. For instance, embodiments of the disclosure may include forming a gate dielectric layer 140 on semiconductor fin(s) 109 over second area 104B. One or more gate conductors 142 can be formed above semiconductor fin(s) 109 and on gate dielectric layer 140, e.g., to provide conductive material for controlling FinFET transistors of second area 104B. Gate conductor 142 may include any currently known or later developed conductive materials (e.g., titanium nitride (TiN), tantalum nitride (TaN), polycrystalline silicon, various silicide compounds, and/or various conductive metals). During processing, semiconductor layer 116 may be removed to allow forming of gate dielectric layer 140, followed by gate conductor 142 formation.

Figure 12:
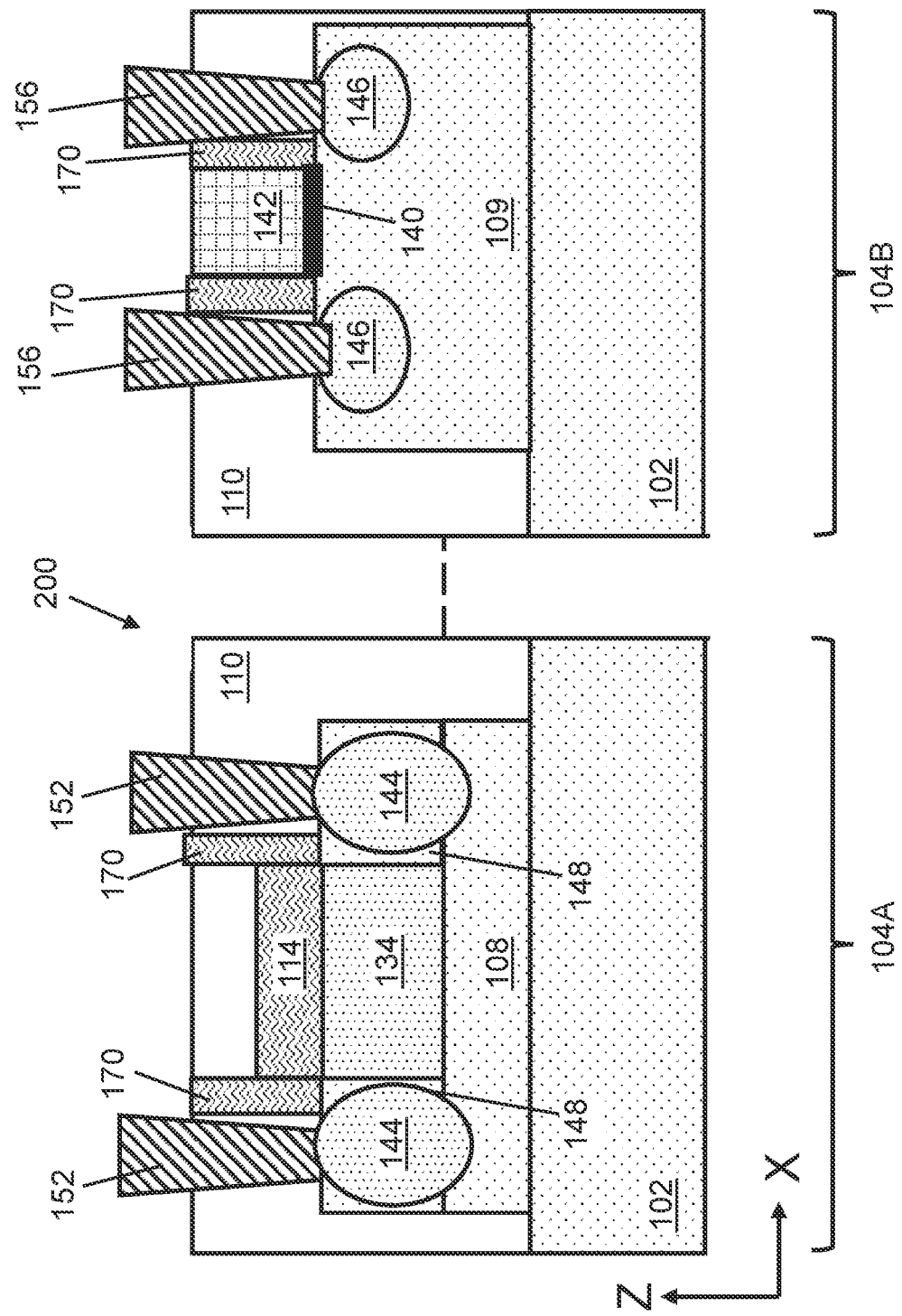
FIG. 12 depicts a lengthwise cross-sectional view of the bipolar transistor structure and adjacent CMOS device according to embodiments of the disclosure.

Referring to FIG. 12, which depicts lengthwise cross-sections of each semiconductor fin 108, 109 and material(s) formed thereof, the processing of each semiconductor fin 108 is discussed in further detail. As discussed elsewhere herein, semiconductor fin 108 may include intrinsic base region 134 below insulative cap 114. Intrinsic base region 134 may be lightly doped to provide limited lengthwise conductivity between E/C materials 136a, 136b (FIG. 10) through semiconductor fin 108, e.g., upon application of a base current as discussed herein.

Other portions of semiconductor fin 108, e.g., those not located below insulative cap 114, may not undergo condensation and/or doping at the same time as intrinsic base region 134 due to not being covered by base material 130 (FIGS. 6, 7) and/or insulator film 132 (FIG. 7). Instead, outer lengthwise portions of semiconductor fin 108 may be doped separately and/or to a higher dopant concentration than intrinsic base region 134. For example, various dopants may be introduced into outer lengthwise portions of semiconductor fin 108 (e.g., by ion implantation) to form a set of extrinsic base regions 144 therein. In addition, and optionally in the same instance of doping, portions of semiconductor fin 109 may be doped to define a set of source/drain (S/D) regions 146 within semiconductor fin 109, and on opposite lengthwise ends of gate conductor 142. Forming intrinsic base region 134, extrinsic base regions 144, and S/D region 146 in this manner causes intrinsic base region 134 of semiconductor fin 108 to be discontinuous with extrinsic base regions 144.

The discontinuity between intrinsic base region 134 and extrinsic base regions 144 within semiconductor fin 108 may define an intermediate region 148 horizontally between intrinsic base region 134 and each extrinsic base region 144. Intermediate region 148 may have the same dopant type and/or concentration as underlying portions of semiconductor fin 108, and thus may have a lower dopant concentration than intrinsic base region 134 and/or extrinsic base regions 144. Applying a base current to extrinsic base region 144 thus will control the conductivity of semiconductor fin 108 in intrinsic base region 134 without significant risk of electrical shorting between intrinsic base region 134 and extrinsic base regions 144.

Figure 13:
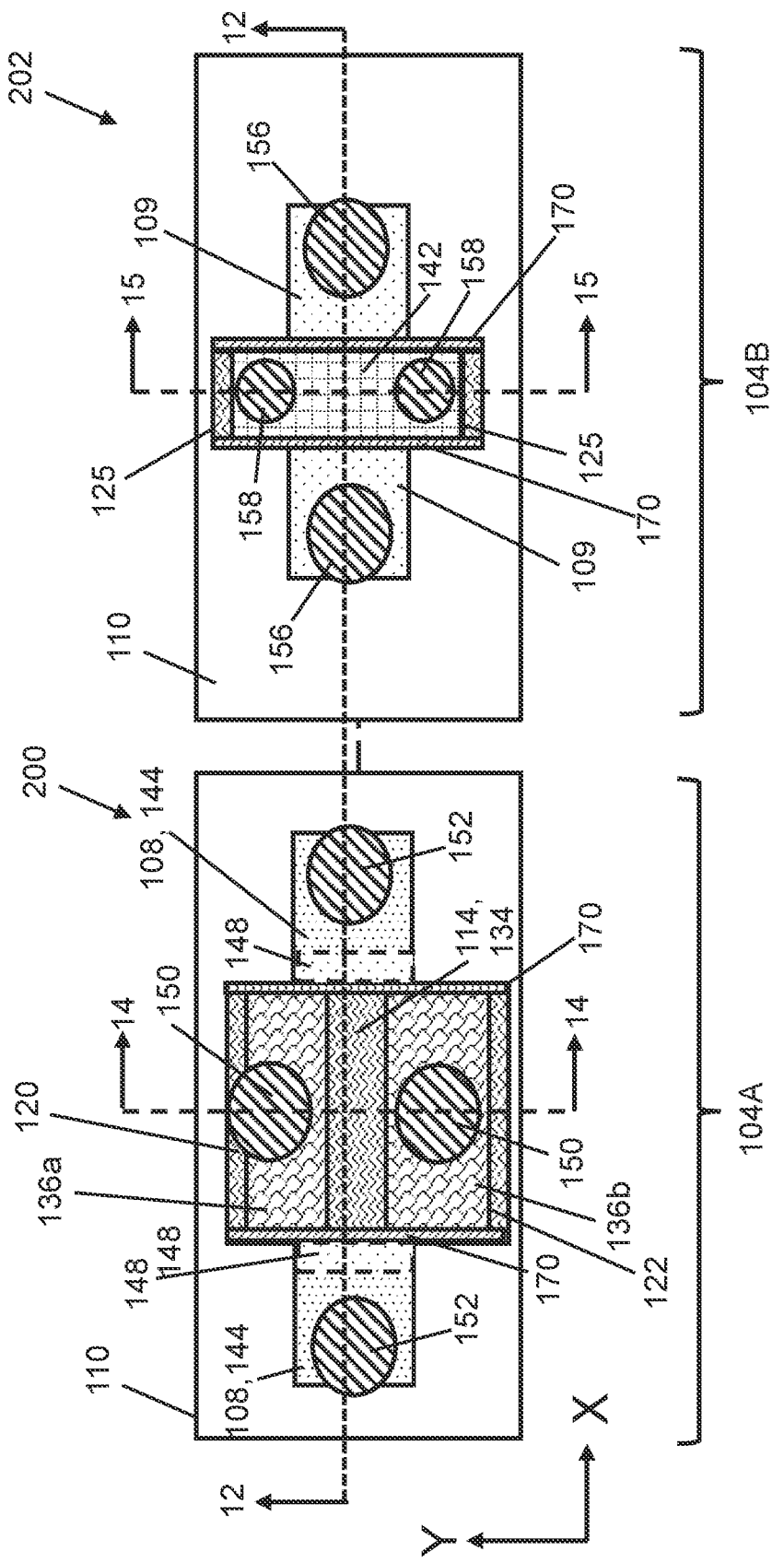
FIG. 13 depicts a plan view of a bipolar transistor structure and adjacent CMOS device according to embodiments of the disclosure.
Figure 14:
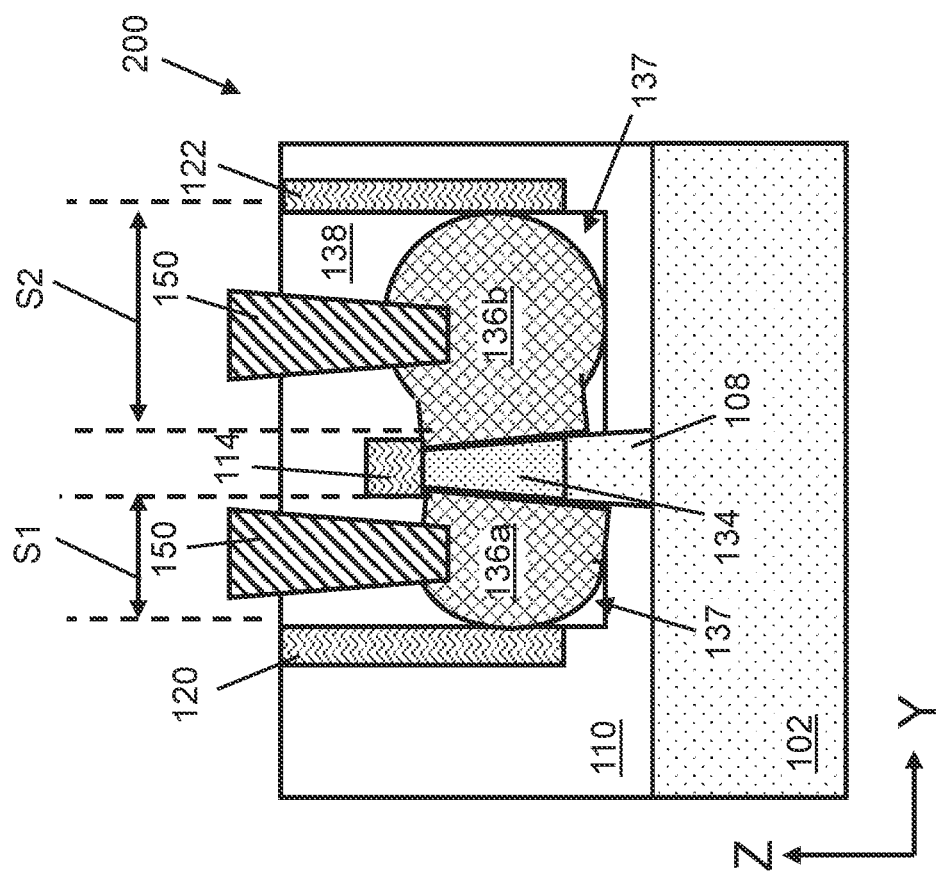
FIG. 14 depicts a first widthwise cross-sectional view along line 14-14 of FIG. 13 of the bipolar transistor structure according to embodiments of the disclosure.
Figure 15:
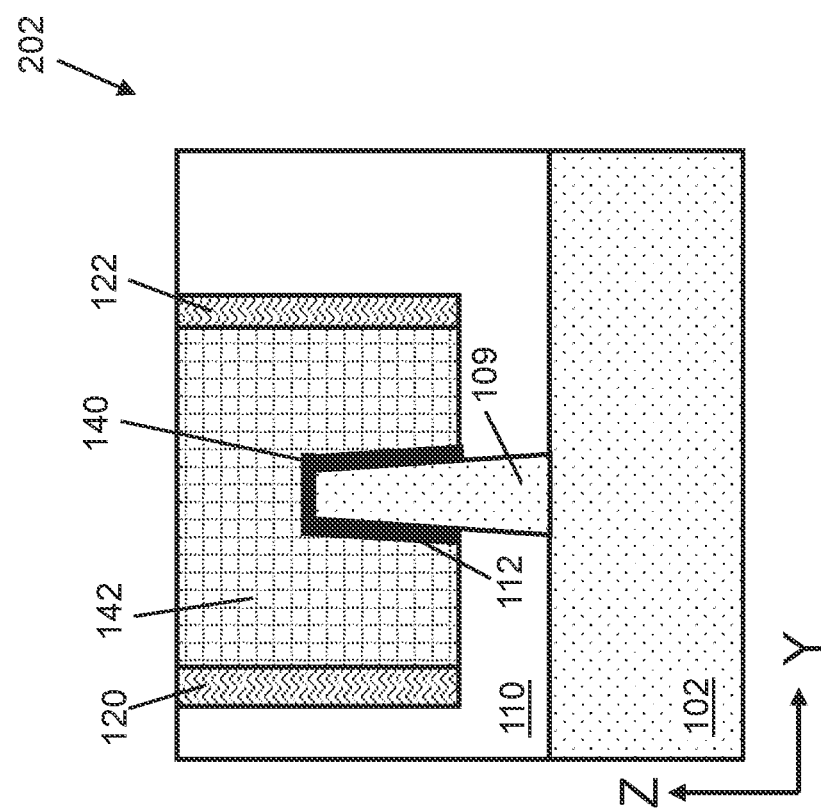
FIG. 15 depicts a second widthwise cross-sectional view along line 15-15 of FIG. 13 of an adjacent CMOS structure according to embodiments of the disclosure.

Referring to FIGS. 12-15, FIG. 13 depicts a plan view of a bipolar transistor structure 200 and a CMOS device 202, and FIGS. 12, 13, and 15 depict cross-sectional views of bipolar transistor structure 200 and CMOS device 202 where applicable along corresponding view lines of FIG. 12. Further processing according to the disclosure may include forming conductive contacts to various elements within first area 104A and second area 104B to form a bipolar transistor and FinFET transistor in each area 104A, 104B. To electrically couple E/C materials 136a, 136b to overlying layers and/or structures, a set of E/C contacts 150 may be formed to E/C materials 136a, 136b and within insulator layer 110. E/C contact(s) 150 may include any currently known or later developed material to form a conductive electrical pathway, e.g., tungsten (W), copper (Cu), aluminum (Al), etc. Some portions of E/C materials 136a, 136b may include silicide regions (i.e., portions of semiconductor that are annealed in the presence of an overlying conductor) to increase the electrical conductivity at their physical interface with E/C contact(s) 150, where applicable. Due to the difference in size (including horizontal width) between E/C materials 136a, 136b, E/C contacts 150 formed thereto may not necessarily be horizontally symmetric about semiconductor fin 108.

E/C contacts 150 may additionally include refractory metal liners (not shown) positioned alongside insulator layer 110 to prevent electromigration degradation, shorting to other components, etc. Base contact(s) 152 to semiconductor fin 108 also may be formed, e.g., by removing overlying portions of insulator layer 110 to form an opening and filling the opening with conductive material(s). Base contacts 152 may be formed using any material(s) and/or discussed herein regarding E/C contact(s) 150, including forming silicide material(s) (not shown) on semiconductor fin 108, and moreover may include refractory metal liners adjacent insulator layer 110.

Along with the forming of E/C contacts 150 and base contacts 152, conductive material also may be formed to semiconductor fin(s) 109 within second area 104B to form source/drain (S/D) contacts 156 and gate contacts 158 for use in a FinFET device. S/D contacts 156 and/or gate contacts 158 may include the same conductive materials as E/C contact(s) 150 and/or base contacts 152. In some cases, contacts 150, 152, 156, 158 may be formed simultaneously via a single deposition of conductive metal(s). To physically and separate contacts 150, 152, 156, 158, a set of spacers 170 additionally may be formed within insulator layer 110. Spacers 170 may have the same or similar materials as spacers 120, 122, 125 discussed herein, and may be formed at respective positions (e.g., alongside insulator cap 114 or gate conductor 142) and optionally may be formed in the same process(es) to form spacers 120, 122, 125.

Embodiments of the disclosure provide bipolar transistor structure 200 with semiconductor fin 108 on substrate 102 and having a first doping type within intrinsic base 134 and extrinsic base 144. Bipolar transistor structure 200 may have E/C material 136a adjacent one sidewall of semiconductor fin 108 and another E/C material 136b adjacent an opposite sidewall of semiconductor fin 108. E/C material 136b may have a larger width (e.g., along Y-axis) than E/C material 136a, and thus E/C materials 136a, 136b may be asymmetric about semiconductor fin 108. The relative width of each E/C material 136a, 136b may arise from spacers 120, 122 having distinct horizontal separation distances S1, S2 from semiconductor fin 108.

Among other advantages, the difference in size between E/C materials 136a, 136b may reduce the effect of CMOS processing elsewhere in the same device on bipolar transistor structure 200. Specifically, the thermal annealing of CMOS device 202 (e.g., a FinFET transistor) on second area 104B will not significantly degrade the structure and composition of at least the smaller size E/C material(s) 136a, 136b due to having a smaller amount of exposed surface area. Bipolar transistor structure 200 may also provide other advantageous structural features. For example, air gap 137 may be vertically between insulator layer 110 and E/C materials 136a, 136b. Bipolar transistor structure 200 also may include, e.g., intrinsic base region 134 below insulative cap 114 and extrinsic base regions 144 within lengthwise ends of semiconductor fin 108. Intermediate portions optionally may separate intrinsic base region 134 from extrinsic base regions 144 for stronger control of electric currents between E/C materials 136a, 136b through semiconductor fin 108.

The use of semiconductor fin(s) 108 to define portions of a bipolar transistor also provide a lower base width and thereby improve responsiveness of the bipolar transistor to electrical currents. CMOS device 202 also may be on substrate 102 at a location distal to semiconductor fin 108. CMOS device 202 may include semiconductor fin 109, S/D regions 146, and gate conductor 142 on gate insulator 140 as discussed elsewhere herein.

Figure 16:
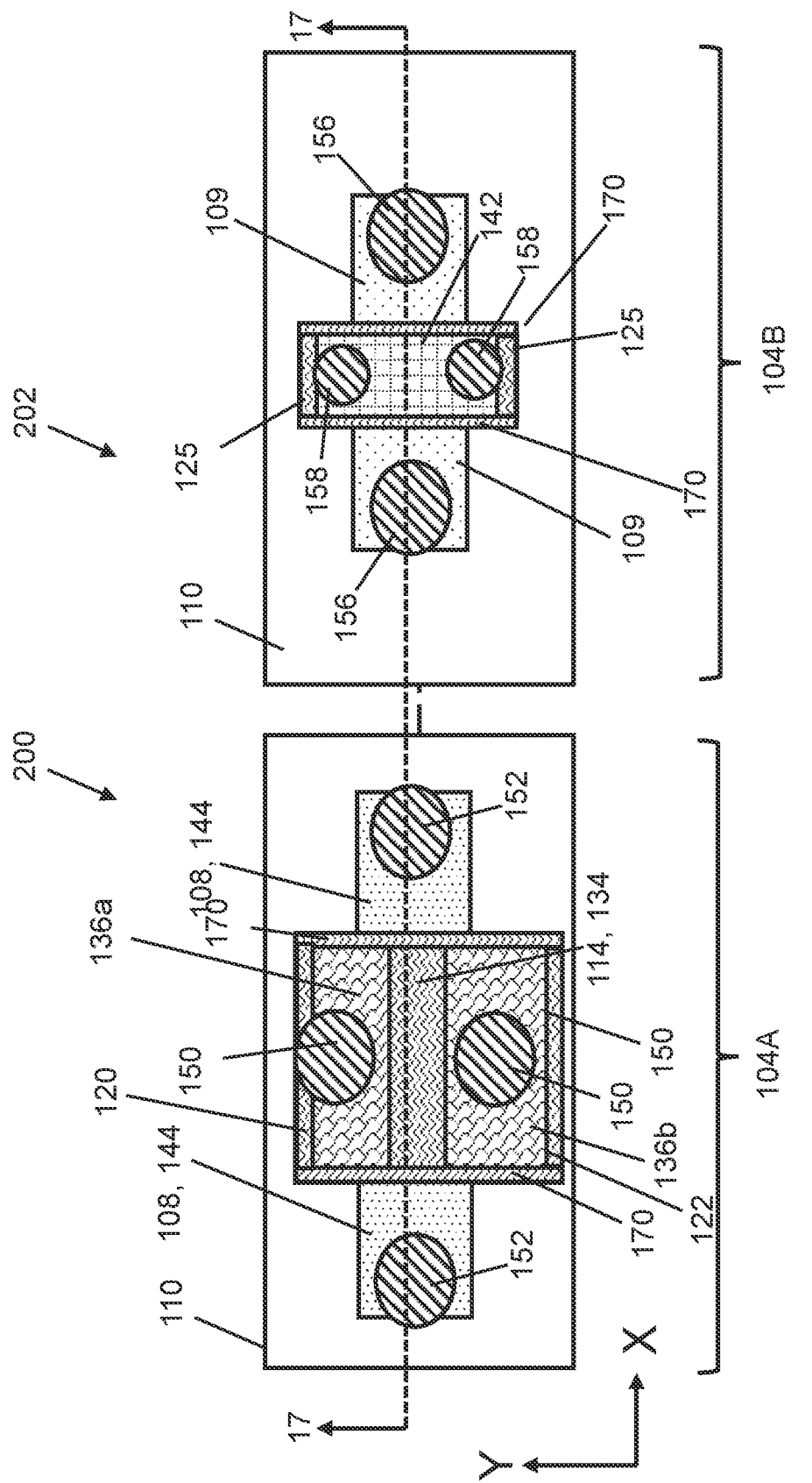
FIG. 16 depicts a plan view of a bipolar transistor structure and CMOS device therein according to further embodiments of the disclosure.
Figure 17:
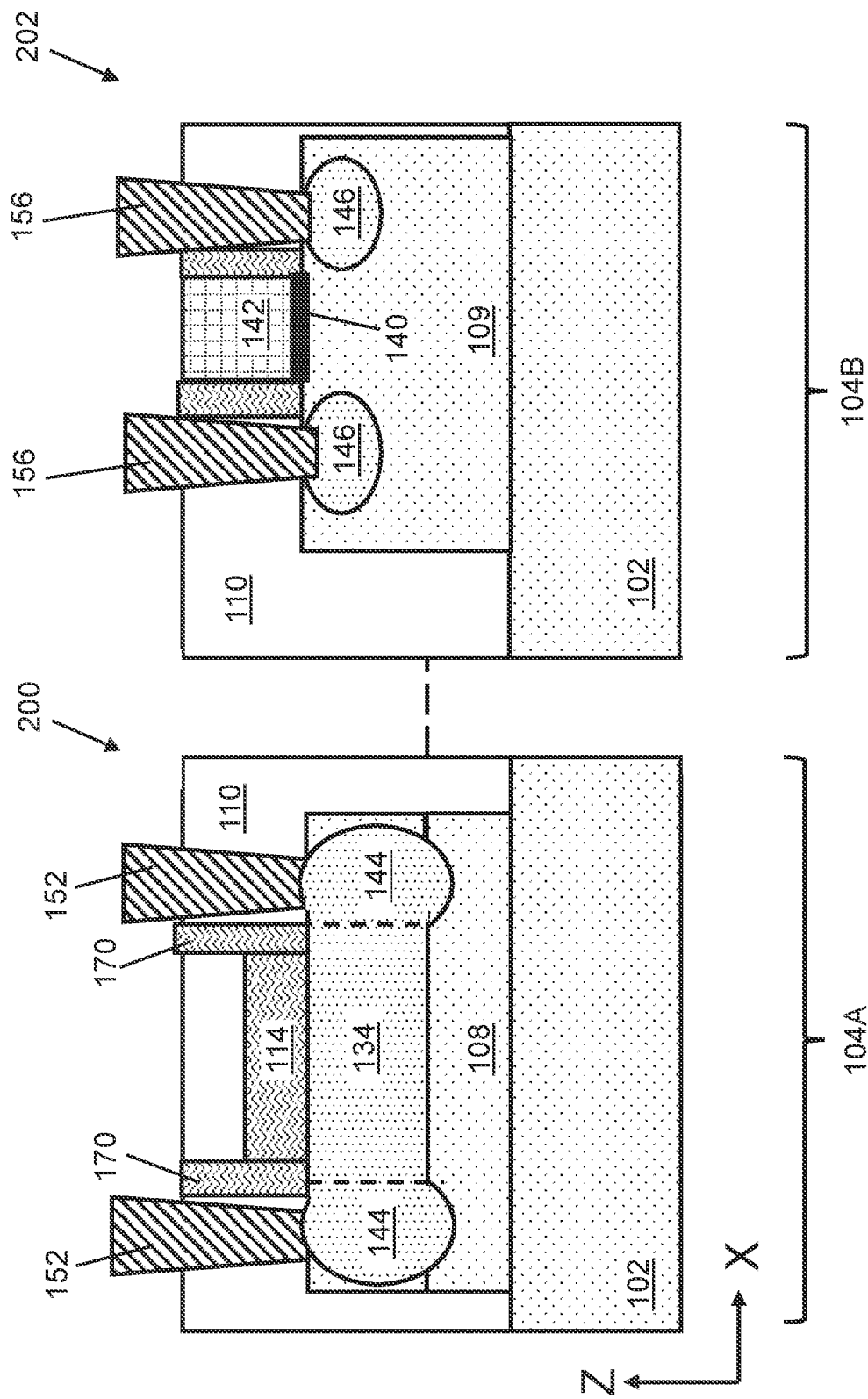
FIG. 17 depicts a lengthwise cross-sectional view along line 17-17 of FIG. 16 of the bipolar transistor structure and CMOS device according to further embodiments of the disclosure.

FIGS. 16 and 17 depict further embodiments of bipolar transistor structure 200 and CMOS device 202, with FIG. 17 being viewed along line 17-17 of FIG. 16. In some implementations, base region 134 and extrinsic base region 144 may be structurally continuous within semiconductor fin 108. In this case, each base region 134, 144 of bipolar transistor structure 200 may be formed by various forms of conventional doping, e.g., instead of intrinsic base region 134 being formed by condensation and/or similar processes discussed herein. In this case, intrinsic base region 134 may have a lower dopant concentration than extrinsic base region 144 but no intermediate region(s) 148 (FIG. 12) may exist horizontally between base regions 134, 144. The boundaries between intrinsic base region 134 and extrinsic base regions 144 are indicated with dashed lines in FIG. 17 to show that base regions 134, 144 may have the same material composition but different amounts of dopants. Notwithstanding this variation in the shape and configuration of regions base regions 134, 144, bipolar transistor structure 200 and CMOS device 202 otherwise may be structurally and operationally similar to other embodiments discussed herein.

The terminology used herein is for the purpose of describing embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). As used herein, the term "and/or" includes all combinations of one or more of the associated listed items.

What is claimed is:

1. A bipolar transistor structure comprising:
   a semiconductor fin on a substrate, the semiconductor fin having a first doping type, a length in a first direction, and a width in a second direction perpendicular to the first direction;
   a first emitter/collector (E/C) material between and contacting a first sidewall of a first spacer horizontally adjacent the first E/C material and a first sidewall of the semiconductor fin, the first E/C material being along the width of the semiconductor fin, and the first E/C material having a second doping type opposite the first doping type and having a first width;
   a second E/C material between and contacting a first sidewall of a second spacer horizontally adjacent the second E/C material and a second sidewall of the semiconductor fin, the second E/C material being along the width of the semiconductor fin, and the second E/C material having the second doping type and having a second width different from the first width of the first E/C material;
   an insulator layer separating the first and second E/C materials from the substrate, wherein the insulator layer contacts a portion of the first and second sidewalls of the semiconductor fin, a second sidewall of the first spacer, and a second sidewall of the second spacer,
   wherein a horizontal distance between the first sidewall of the semiconductor fin and the first spacer is different than a horizontal distance between the second sidewall of the semiconductor fin and the second spacer, and
   wherein a top surface of the first spacer and a top surface of the second spacer extend above a top surface of the semiconductor fin.

2. The bipolar transistor structure of claim 1, further comprising a complementary metal oxide semiconductor (CMOS) device on the substrate and horizontally distal to the semiconductor fin.

3. The bipolar transistor structure of claim 1, further comprising a trench isolation (TI) adjacent a lower portion of the semiconductor fin, wherein the first E/C material and the second E/C material are over the TI.

4. The bipolar transistor structure of claim 3, further comprising an air gap vertically between the TI and the first E/C material or the second E/C material.

5. The bipolar transistor structure of claim 1, wherein the semiconductor fin includes:
   an extrinsic base region in a first portion of the semiconductor fin; and
   an intrinsic base region in a second portion of the semiconductor fin adjacent the first portion along the length of the semiconductor fin, and horizontally between the first E/C material and the second E/C material along the width of the semiconductor fin, wherein the intrinsic base region has a lower dopant concentration than a dopant concentration of the extrinsic base region.

6. The bipolar transistor structure of claim 5, wherein the semiconductor fin includes an intermediate portion between the first portion and the second portion along the length of the semiconductor fin, wherein the intermediate portion has a lower dopant concentration than the dopant concentration of the intrinsic base region.

7. A bipolar transistor structure comprising:
   a semiconductor fin on a substrate, the semiconductor fin having a first doping type, a length in a first direction, and a width in a second direction perpendicular to the first direction, wherein the semiconductor fin includes:
   a first portion, and
   a second portion coupled to a base contact and adjacent the first portion along the length of the semiconductor fin, wherein a dopant concentration of the second portion is greater than a dopant concentration of the first portion;
   a first emitter/collector (E/C) material between and contacting a first sidewall of a first spacer horizontally adjacent the first E/C material and a first sidewall of the second portion, the first E/C material being along the width of the semiconductor fin, and the first E/C material having a second doping type opposite the first doping type and having a first width; and
   a second E/C material between and contacting a first sidewall of a second spacer horizontally adjacent the second E/C material and a second sidewall of the second portion, the second E/C material being along the width of the semiconductor fin, and the second E/C material having the second doping type and having a second width different from the first width of the first E/C material;
   an insulator layer separating the first and second E/C materials from the substrate, wherein the insulator layer contacts a portion of the first and second sidewalls of the semiconductor fin, a second sidewall of the first spacer, and a second sidewall of the second spacer, wherein a horizontal distance between the first sidewall of the semiconductor fin and the first spacer is different than a horizontal distance between the second sidewall of the semiconductor fin and the second spacer, and wherein a top surface of the first spacer and a top surface of the second spacer extend above a top surface of the semiconductor fin.

8. The bipolar transistor structure of claim 7, further comprising a complementary metal oxide semiconductor (CMOS) device on the substrate and horizontally distal to the semiconductor fin.

9. The bipolar transistor structure of claim 7, further comprising a trench isolation (TI) adjacent a lower portion of the semiconductor fin, wherein the first E/C material and the second E/C material are over the TI.

10. The bipolar transistor structure of claim 9, further comprising an air gap vertically between the TI and the first E/C material or the second E/C material.

11. The bipolar transistor structure of claim 7, wherein the semiconductor fin includes an intermediate portion between the first portion and the second portion along the length of the semiconductor fin, wherein the intermediate portion has a lower dopant concentration than the dopant concentration of the first portion and the dopant concentration of the second portion.

12. The bipolar transistor structure of claim 11, further comprising a masking material over the semiconductor fin, and horizontally between the first E/C material and the second E/C material along the width of the semiconductor fin.

13. A method of forming a bipolar transistor structure, the method comprising:

forming a semiconductor fin on a substrate, the semiconductor fin having a first doping type, a length in a first direction, and a width in a second direction perpendicular to the first direction;

forming an insulator layer on the substrate;

forming a first emitter/collector (E/C) material adjacent a first sidewall of the semiconductor fin along the width of the semiconductor fin, the first E/C material having a second doping type opposite the first doping type;

forming a second E/C material adjacent a second sidewall of the semiconductor fin along the width of the semiconductor fin, the second E/C material having the second doping type, wherein a width of the first E/C material is different from a width of the second E/C material;

forming a first spacer over the substrate and horizontally distal to the first sidewall of the semiconductor fin, wherein a first sidewall of the first spacer contacts the first E/C material; and forming a second spacer over the substrate and horizontally distal to the second sidewall of the semiconductor fin, wherein a first sidewall of the second spacer contacts the second E/C material, and wherein a top surface of the first spacer and a top surface of the second spacer extend above a top surface of the semiconductor fin, wherein the insulator layer separates the first and second E/C materials from the substrate, wherein the insulator layer contacts a portion of the first and second sidewalls of the semiconductor fin, a second sidewall of the first spacer, and a second sidewall of the second spacer, and wherein a first horizontal distance between the first sidewall of the semiconductor fin and the first spacer is different than a second horizontal distance between the second sidewall of the semiconductor fin and the second spacer, the first horizontal distance defines a first width of the first E/C material, and the second horizontal distance defines a second width of the second E/C material different from the first width of the first E/C material, and wherein the first E/C material contacts and extends between the first sidewall of the semiconductor fin and the first spacer, and wherein the second E/C material contacts and extends between the second sidewall of the semiconductor fin and the second spacer.

14. The method of claim 13, further comprising forming a complementary metal oxide semiconductor (CMOS) device on the substrate and horizontally distal to the semiconductor fin.

15. The method of claim 13, further comprising forming a trench isolation (TI) adjacent a lower portion of the semiconductor fin, wherein the first E/C material and the second E/C material are over the TI.

16. The method of claim 15, wherein forming the first E/C material and the second E/C material includes forming an air gap vertically between the TI and the first E/C material or the second E/C material.

17. The method of claim 13, further comprising:

forming an extrinsic base region in a first portion of the semiconductor fin; and forming an intrinsic base region in a second portion of the semiconductor fin adjacent the first portion along the length of the semiconductor fin, and horizontally between the first E/C material and the second E/C material along the width of the semiconductor fin, wherein the intrinsic base region has a lower dopant concentration than a dopant concentration of the extrinsic base region.

* * * * *